United States Patent
Kim

(10) Patent No.: US 9,941,218 B2
(45) Date of Patent: Apr. 10, 2018

(54) DISPLAY APPARATUS CAPABLE OF EASILY ACQUIRING IDENTIFICATION ABOUT A DISPLAY PANEL AND A DRIVING CHIP

(71) Applicant: SAMSUNG DISPLAY CO., LTD., Yongin-si, Gyeonggi-do (KR)

(72) Inventor: Jae-kyoung Kim, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/263,177

(22) Filed: Sep. 12, 2016

(65) Prior Publication Data
US 2017/0092593 A1    Mar. 30, 2017

(30) Foreign Application Priority Data
Sep. 30, 2015 (KR) ........................ 10-2015-0138138

(51) Int. Cl.
*H01L 23/544* (2006.01)
*H01L 51/52* (2006.01)
*H01L 27/32* (2006.01)

(52) U.S. Cl.
CPC ........ *H01L 23/544* (2013.01); *H01L 27/3223* (2013.01); *H01L 27/3248* (2013.01); *H01L 51/524* (2013.01); *H01L 2223/5442* (2013.01); *H01L 2223/5448* (2013.01); *H01L 2223/54433* (2013.01); *H01L 2223/54486* (2013.01)

(58) Field of Classification Search
CPC ............. H01L 23/544; H01L 2223/544; H01L 2223/54413; H01L 2223/54433
See application file for complete search history.

(56) References Cited

U.S. PATENT DOCUMENTS 5,970,147 A    10/1999  Davis
2016/0181205 A1*  6/2016  Yu ..................... H01L 21/67294
                                                                257/797

FOREIGN PATENT DOCUMENTS

| KR | 2002-0085846 A | 11/2002 |
| KR | 10-0769816 B1  | 10/2007 |
| KR | 10-1312943 B1  | 10/2013 |
| KR | 10-2015-0007492 A | 1/2015 |

* cited by examiner

*Primary Examiner* — Hoai V Pham
(74) *Attorney, Agent, or Firm* — Lewis Roca Rothgerber Christie LLP

(57) ABSTRACT

A display apparatus is provided including a display panel displaying an image, and a driving chip including a front surface and a rear surface provided with a first marking code, the driving chip being electrically connected with the display panel. The display panel includes an upper substrate, and a lower substrate located facing the upper substrate to include a second marking code, and including a first surface and a second surface facing the first surface. The driving chip is located on the second surface such that a rear surface thereof is closer to the second surface than to the front surface thereof, and wherein the second marking code is provided on the second surface.

15 Claims, 10 Drawing Sheets

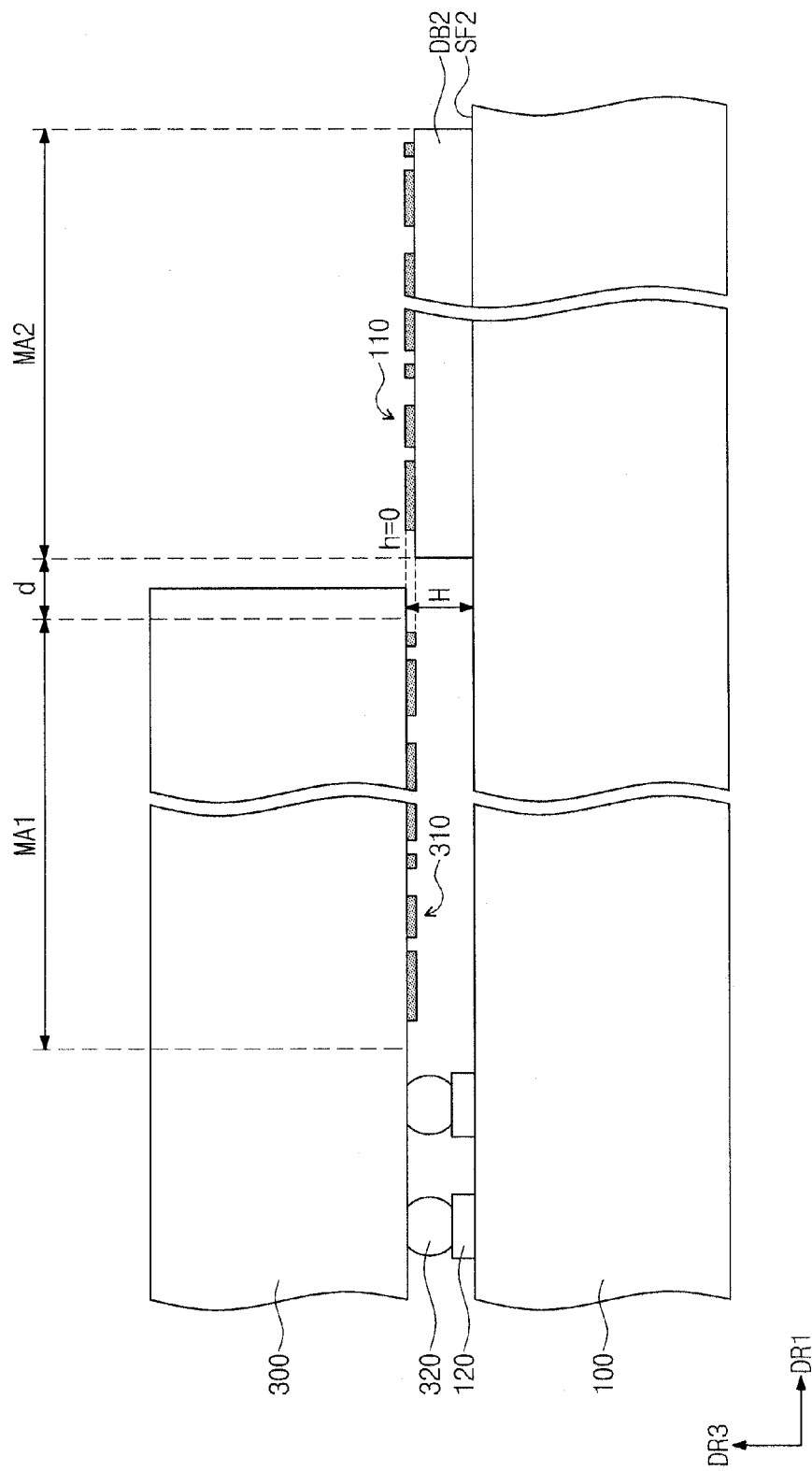

DISPLAY APPARATUS CAPABLE OF EASILY ACQUIRING IDENTIFICATION ABOUT A DISPLAY PANEL AND A DRIVING CHIP

CROSS-REFERENCE TO RELATED APPLICATIONS

This U.S. non-provisional patent application claims priority under 35 U.S.C. § 119 of Korean Patent Application No. 10-2015-0138138, filed on Sep. 30, 2015, the entire contents of which are hereby incorporated by reference.

BACKGROUND

The present disclosure herein relates to a display apparatus.

Examples of display apparatuses are liquid crystal displays, field emission displays, plasma display panels, and organic electroluminescent displays. To operate a display apparatus, components for generating various control signals, data signals, etc, may typically be mounted on a substrate which constitutes the display apparatus. Methods for mounting components may be classified into a chip on glass (COG) method, a chip on flexible printed circuit (COF) method, or etc. The COG method is a method for directly mounting components such as integrated circuit (IC) chips on a substrate, and the COF method is a method for mounting a film on a substrate after mounting components such as IC chips on a film such as a polymide film.

SUMMARY

The present disclosure provides a display apparatus capable of easily acquiring identification information about a display panel and a driving chip.

An embodiment of the inventive concept provides a display apparatus including a display panel configured to display an image, and a driving chip including a front surface and a rear surface provided with a first marking code, and the driving chip being electrically connected with the display panel. The display panel includes an upper substrate, and a lower substrate located facing the upper substrate to include a second marking code, and including a first surface and a second surface facing the first surface. The driving chip is located on the second surface such that a rear surface thereof is more adjacent to the second surface than to the front surface thereof, and the second marking code is provided on the second surface.

In an embodiment, the first marking code may include identification information about the driving chip, and the second marking code may include identification information about the display panel.

In an embodiment, the lower substrate may further include a pad part which is located on the second surface of the lower substrate and electrically connected with the driving chip, and the second marking code may overlap the pad part.

In an embodiment, the driving chip may include a plurality of bumps located on the rear surface thereof, wherein the first marking code may be positioned at an edge of at least one side of the rear surface.

In an embodiment, the rear surface of the driving chip may include a first marking code area and a bump area, wherein the first marking code area may be defined at one edge of the rear surface of the driving chip, the first marking code may be positioned on the first marking code area, and the plurality of bumps may be positioned on the bump area.

In an embodiment, the second surface of the lower substrate may include a second marking code area, a first region, and a second region, wherein the second marking code may be positioned on the second marking code area, the first region may overlap the first marking code area, and the second region may overlap the bump area.

In an embodiment, the display panel may further include a plurality of contact terminals located on the second region and electrically connected with the bumps.

In an embodiment, the first and second marking code areas may be arranged adjacent to each other such that a reading region of a code reader reading the first and second marking codes may overlap the first and second marking code areas.

In an embodiment, when viewed in a plane, the first and second marking codes may be located at a distance smaller than a width of each of the first and second marking codes.

In an embodiment, the driving chip may further include a first dummy layer located between the first marking code and the rear surface of the driving chip, wherein the first marking code may be provided on the first dummy layer.

In an embodiment, the lower substrate may further include a second dummy layer located between the second surface and the second marking code, wherein the second marking code may be provided on the second dummy layer.

In an embodiment, each of the first and second marking codes may be a laser marking.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings:

FIG. 10 is a cross-sectional view illustrating a display apparatus according to another embodiment of the inventive concept.

DETAILED DESCRIPTION

Figure 1:
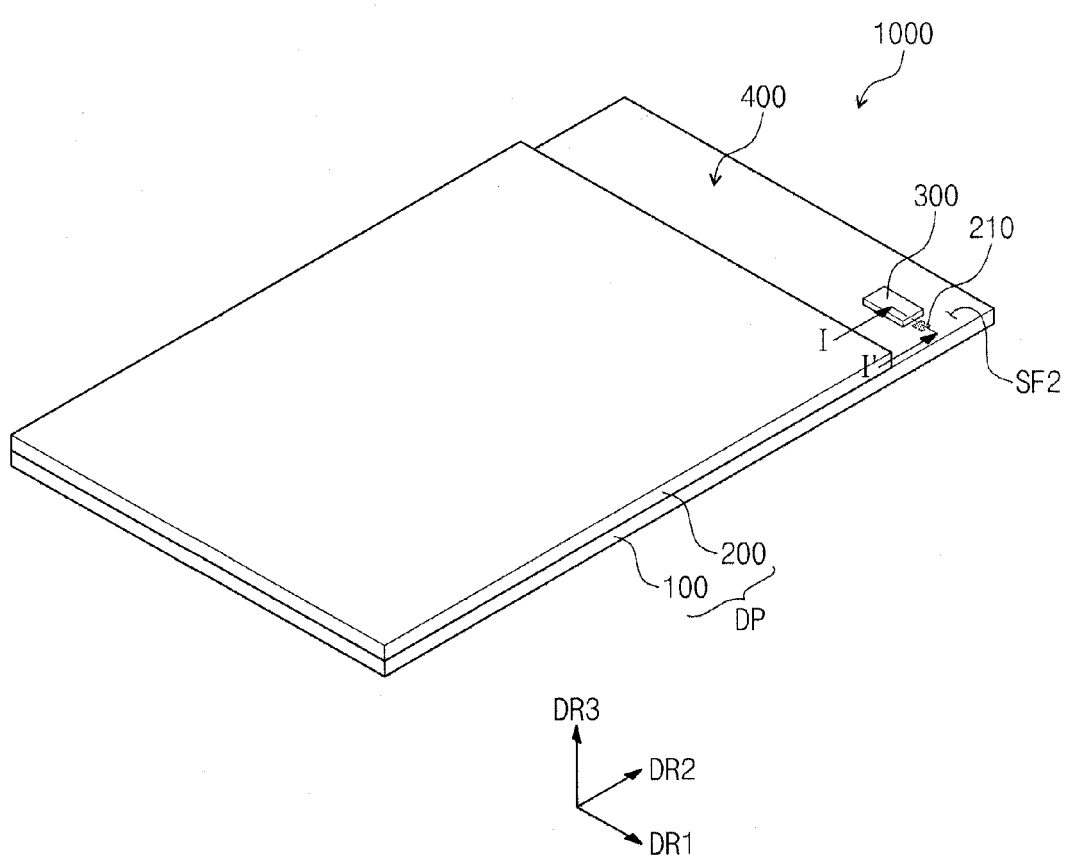
FIG. 1 is a perspective view illustrating a display apparatus according to an embodiment of the inventive concept.

Features of the present disclosure and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is defined by the claims. Like reference numerals refer to like elements throughout.

It will be understood that when an element or a layer is referred to as being "above" or "on" another element or layer, it can be directly on the other element or layer, or intervening layers or elements may also be present. On the contrary, when an element is referred to as being "directly on" another element or layer, it will be understood that intervening layers or elements are not present. The term 'and/or' includes any and all combinations of one or more of the associated listed item.

The terms "lower" and "upper" representing spatial relativity may be used to easily describe the correlation between an element or component and another element or component as shown in the drawings. The terms representing spatial relativity should be understood as terms including different directions of an element in use or in operation in addition to the direction shown in the drawings. Like reference numerals refer to like elements throughout.

It will be understood that, although the terms first, second, etc. may be used herein to describe various elements, components, and/or sections, these elements, components, and/or sections should not be limited by these terms. These terms are only used to distinguish one element, component, and/or sections from another element, component, and/or sections. Thus, for example, a first element, a first component or a first section discussed below could be termed a second element, a second component or a second section without departing from the teachings of the present disclosure.

Embodiments described in the disclosure are described with reference to plane views and cross-sectional views that are ideal, schematic diagrams of the present disclosure. Accordingly, shapes of the exemplary views may be modified according to manufacturing techniques and/or allowable errors. Therefore, the embodiments of the present disclosure are not limited to the specific shape illustrated in the exemplary views, but may include other shapes that may be created according to manufacturing processes. Areas exemplified in the drawings have general properties, and are used to illustrate a specific shape of a semiconductor package region. Thus, this should not be construed as limited to the scope of the present disclosure.

Hereinafter, exemplary embodiments will be described in detail with reference to the accompanying drawings.

Figure 2:
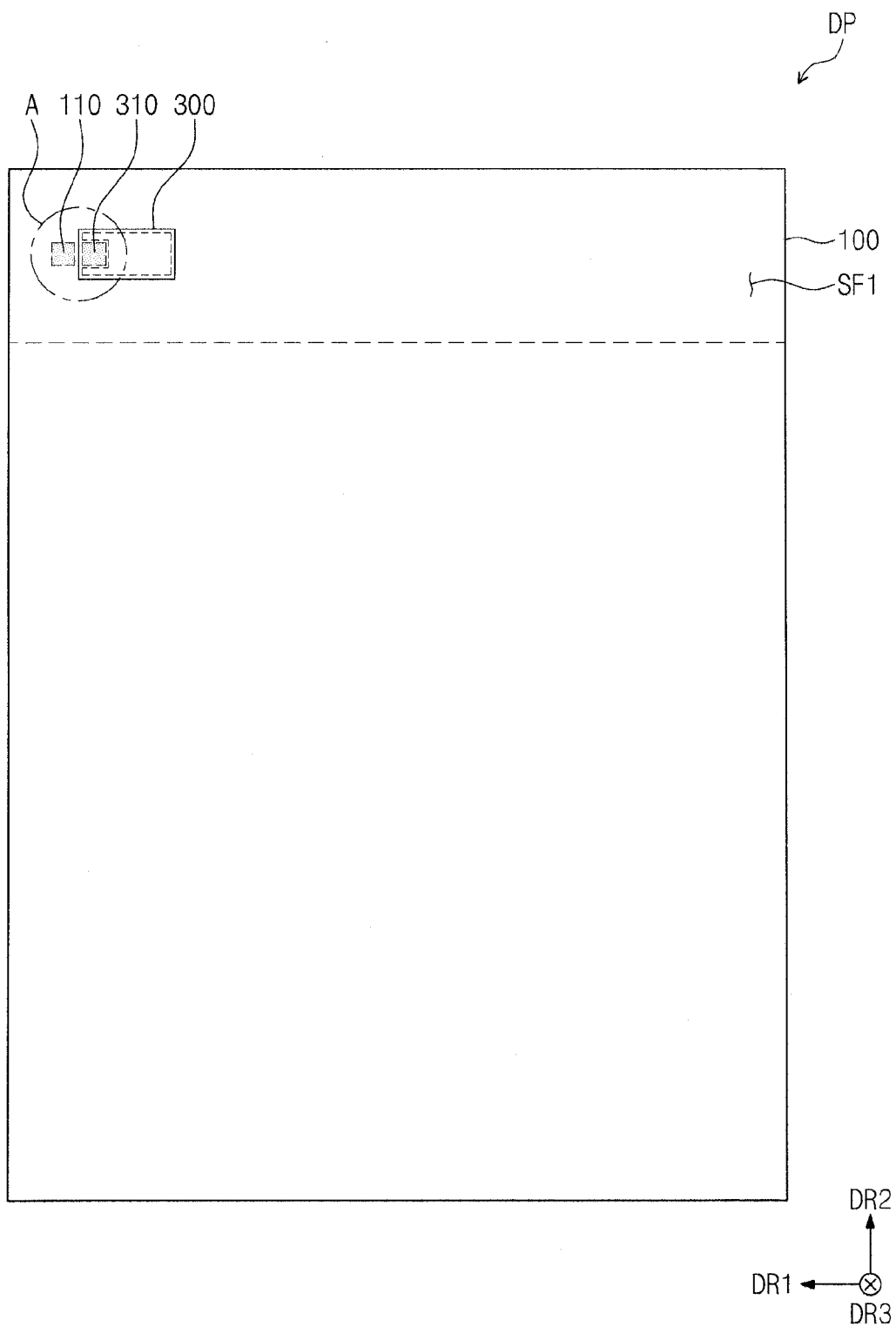
FIG. 2 is a rear view illustrating a display apparatus according to an embodiment of the inventive concept.

FIG. 1 is a perspective view of a display apparatus according to an embodiment of the inventive concept, and FIG. 2 is a rear view of a display apparatus according to an embodiment of the inventive concept.

Referring to FIGS. 1 and 2, a display apparatus 1000 according to an embodiment of the inventive concept includes a display panel DP and a driving chip located on the display panel DP.

The display panel DP is configured to display an image. In one embodiment, the display panel DP may be an organic light emitting display panel. However, the embodiment of the inventive concept is not limited to the kind of the display panel DP. For example, a display panel DP may be a liquid crystal panel, a plasma display panel, an electrophoretic display panel, an electrowetting display panel or the like.

The display panel DP may have a rectangular plate shape including two pairs of sides. In the embodiments below, including the embodiment of FIG. 1, the display panel DP may have a rectangular shape including one pair of long sides and one pair of short sides. The short sides of the display panel DP extend in a first direction DR1, and the long sides of the display panel DP extend in a second direction crossing the first direction DR1 when viewed in a plane.

The display panel DP includes a lower substrate 100 and an upper substrate 200 located over and facing the lower substrate 100. In one embodiment, upward and downward directions are parallel to a third direction DR3 which is defined as the direction perpendicular to the first and second directions DR1 and DR2. The third direction DR3 is a reference direction distinguishing front and rear surfaces of the components that will be described later.

The lower and upper substrates 100 and 200 may be formed of a transparent material. For example, the lower and upper substrates 100 and 200 may include glass.

The lower substrate 100 includes a first surface SF1 and a second surface SF2 opposite the first surface SF1. In an embodiment of the inventive concept, the first surface SF1 is the rear surface of the lower substrate 100, and the second surface SF2 is the front surface of the lower substrate 100. Accordingly, the second surface SF2 of the lower substrate 100 may be more adjacent to the upper substrate 200 than to the first surface SF1.

In an embodiment of the inventive concept, the long sides of the lower substrate 100 are longer than those of the upper substrate 200, i.e., a length of the lower substrate 100 is greater than a length of the upper substrate 200. Accordingly, a portion of the lower substrate 100 may overlap the upper substrate 200.

The lower substrate 100 may include an organic light emitting element including a light emitting material, and transistors driving the organic light emitting element. The organic light emitting element and the transistors are located on the second surface SF2 of the lower substrate 100. The organic light emitting element may generate light corresponding to light emitting materials. The color of the light generated in the organic light emitting element may include red, green, blue, and white, but be not limited thereto. The upper substrate 200 may cover the organic light emitting element, and block air, water, etc. to protect the organic light emitting element.

The lower substrate 100 may further include a pad part 400. The pad part 400 is located on a region on the second surface SF2 of the lower substrate 100, the region not overlapping the upper substrate 200.

The driving chip 300 may be located on the pad part 400 of the lower substrate 100. In the drawings below, the driving chip 300 is located adjacent to one side edge of the pad part 400, but the embodiment of the inventive concept is not limited to the position of the driving chip 300 on the pad part 400. The driving chip 300 is electrically connected with the pad part 400. The driving chip 300 provides a data signal for displaying an image on the display panel DP. The driving chip 300 is located on the pad part 400 through a chip on glass (COG) method. The rear surface of the driving chip 300 is located more adjacent to the second surface of the lower substrate 100 than the front surface of the driving chip 300.

A first marking code 310 is provided on a rear surface of the driving chip 300, and a second marking code 110 is provided on the second surface SF2 of the lower substrate 100. The second marking code 110 is provided on the pad part 400. Hereinafter, the first and second marking codes 310 and 110 will be described in more detail.

Figure 3:
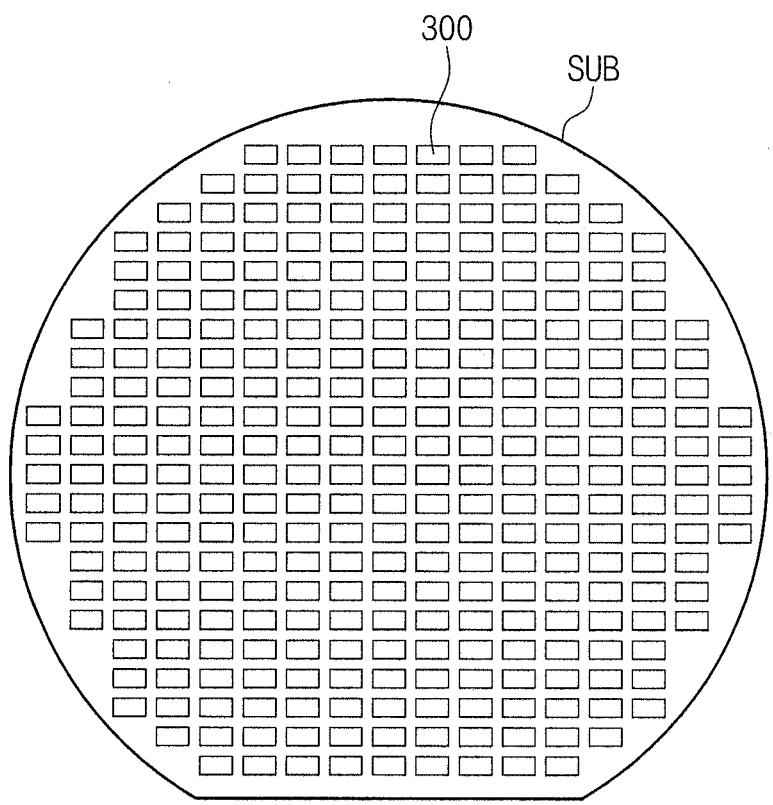
FIG. 3 is a view illustrating a mother substrate for a driving chip.

FIG. 3 is a view illustrating a mother substrate for a driving chip.

Referring to FIGS. 1 to 3, the driving chip 300 illustrated in FIGS. 1 and 2 may be provided by cutting a mother substrate SUB. The mother substrate SUB may be a silicon wafer. Before being cut, a plurality of driving chips 300 may be arranged in a matrix shape and spaced from each other. The first marking code 310 may be printed on the rear surface of each of the driving chips 300 before the driving chips 300 are cut.

Figure 4:
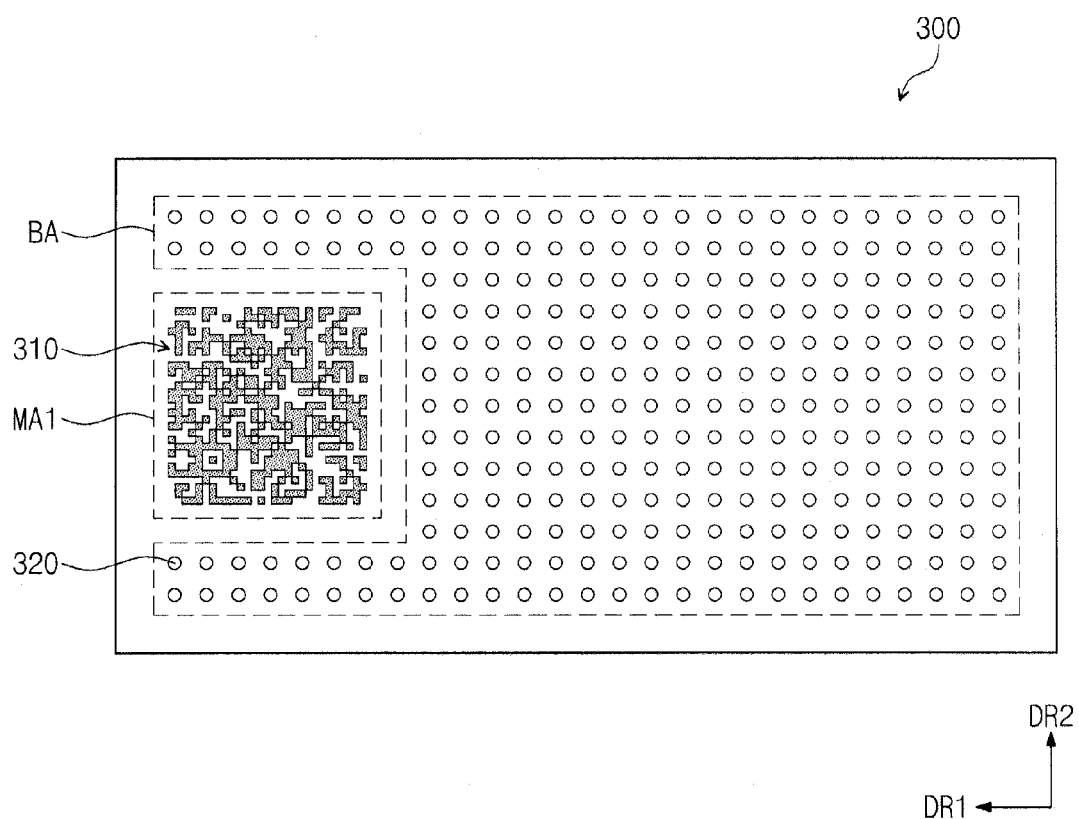
FIG. 4 is a rear view illustrating a display apparatus according to an embodiment of the inventive concept.
Figure 5:
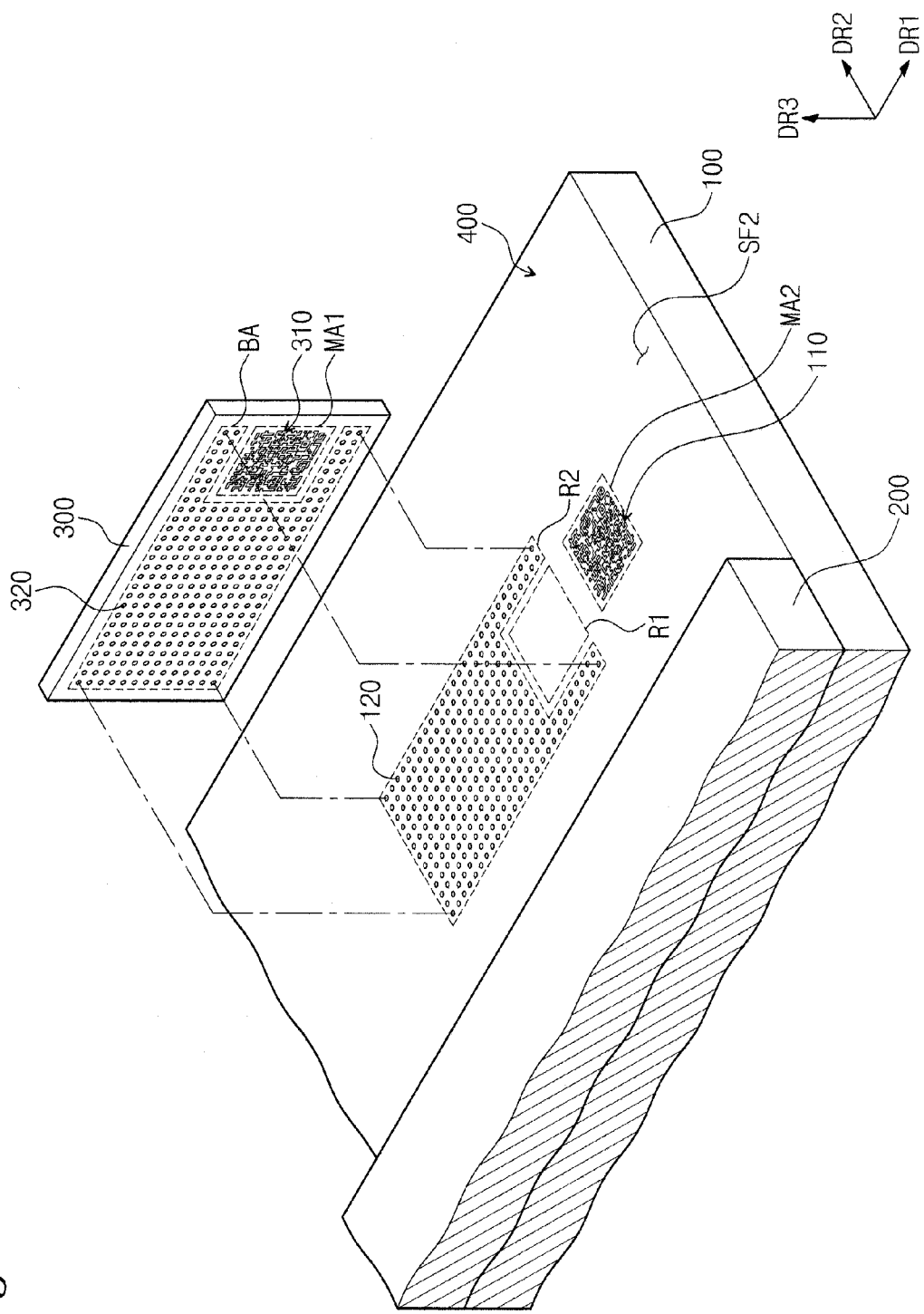
FIG. 5 is a view illustrating a driving chip mounted on a display panel according to an embodiment of the inventive concept.

FIG. 4 is a rear view illustrating a display apparatus according to an embodiment of the inventive concept, and FIG. 5 is a view illustrating a state in which a driving chip is mounted on a display panel according to an embodiment of the inventive concept.

Referring to FIGS. 4 and 5, each of the driving chips 300 provided by cutting a mother substrate SUB may be attached to a second surface SF2 of a display panel DP and thus located on the pad part 400.

The rear surface of the driving chip 300 has a first marking code area MA1 and a bump area BA. The first marking code area MA1 is defined at one edge on the rear surface of the driving chip 300. Specifically, the first marking code area MA1 is defined at one side edge of the rear surface of the driving chip 300 in the first direction DR1. The first marking code 310 may be defined in the first marking code area MA1.

The bump area BA is defined adjacent to the first marking code area MA1 on the rear surface of the driving chip 300. For example, the bump area BA is defined as the remaining region of the rear surface of the driving chip 300 except for the first marking code area MA1.

The driving chip 300 includes a plurality of bumps 320. In one embodiment, the rear surface of the driving chip 300 may be defined as a bump surface. The bumps 320 may be located on the bump area BA. Specifically, in the bump area BA, the bumps 320 may be located to be spaced apart from each other and arranged in a matrix shape. The bumps 320 electrically connect the driving chip 300 with the pad part 400.

The first marking code 310 defines a pattern. However, the embodiment of the inventive concept is not limited to the shape of the first marking code 310. For example, according to another embodiment of the inventive concept, the first marking code 310 may include a numeral or a letter.

The first marking code 310 has a different pattern for each driving chip 300. The first marking code 310 has identification information about the driving chip 300. The identification information about the driving chip 300 is defined as an inherent value of the driving chip 300. The identification information about the driving chip 300 may include lot information, treatment information, device information, and miscellaneous information about the driving chip 300. For example, the lot information about the driving chip 300 may be information regarding the lot number of the driving chip 300, the number of mother substrates, and a number of a mother substrate, or the like. The treatment information about the driving chip 300 may be information regarding the name of the work process and work conditions for manufacturing the driving chip 300, or the like. The device information about the driving chip 300 may be information regarding the device name of the driving chip 300, the size of the driving chip 300, or the like. The miscellaneous information about a driving chip 300 may be information regarding the thickness, strength, bending property, resistance value, driving current, or the like of the driving chip 300. However, the identification information about the driving chip 300 is not limited to kinds thereof, and may include a variety of information about the driving chip 300.

The second surface SF2 of the lower substrate 100 includes a first region R1, a second region R2, and a second marking code area MA2.

The first region R1 overlaps the first marking code area MA1. Since the lower substrate 100 is formed of a transparent material, when viewing the first surface SF1 of the lower substrate 100, the first marking code 310 may be viewed through the first region R1 of the second surface SF2.

The lower substrate 100 further includes a plurality of contact terminals 120. The contact terminals 120 are located on the second region R2. Specifically, the contact terminals 120 may be located to be spaced apart from each other within the second region R2 and arranged in a matrix shape.

The second region R2 overlaps the bump area BA of the driving chip 300. The contact terminals 120 are electrically connected with the bumps 320 of the driving chip 300. For example, the contact terminals 120 may correspond one-to-one to the bumps and may be electrically connected with the bumps 320.

The second marking code area MA2 is adjacent to the first region R1. The second marking code area MA2 does not overlap the rear surface of the driving chip 300. The second marking code 110 may be defined in the second marking code area MA2.

The second marking code 110 defines a pattern. However, the embodiment of the inventive concept is not limited to the shape of the second marking code 110. For example, according to another embodiment of the inventive concept, the second marking code 110 may include a numeral or a letter.

The second marking code 110 has identification information about a display panel DP. The identification information about the display panel DP is defined as an inherent value of the display panel DP. The identification information about the display panel DP may include lot information, treatment information, device information, and miscellaneous information about the display panel DP. For example, the lot information about the display panel DP may be information regarding the lot number of the display panel DP, the number of mother substrates, and a number of a mother substrate, or the like. The treatment information about the display panel DP may be information regarding the name of the work process and work conditions for manufacturing the driving chip 300, or the like. The device information about the display panel DP may be information regarding the device name of the display panel DP, the size of the display panel DP, or the like. The miscellaneous information about the display panel DP may be information regarding the thickness, strength, bending property, resistance value, driving current, or the like of the display panel DP. According to an embodiment of the inventive concept, the identification information about the display panel DP is not limited to kinds thereof, and may include a variety of information about the display panel DP.

Figure 6:
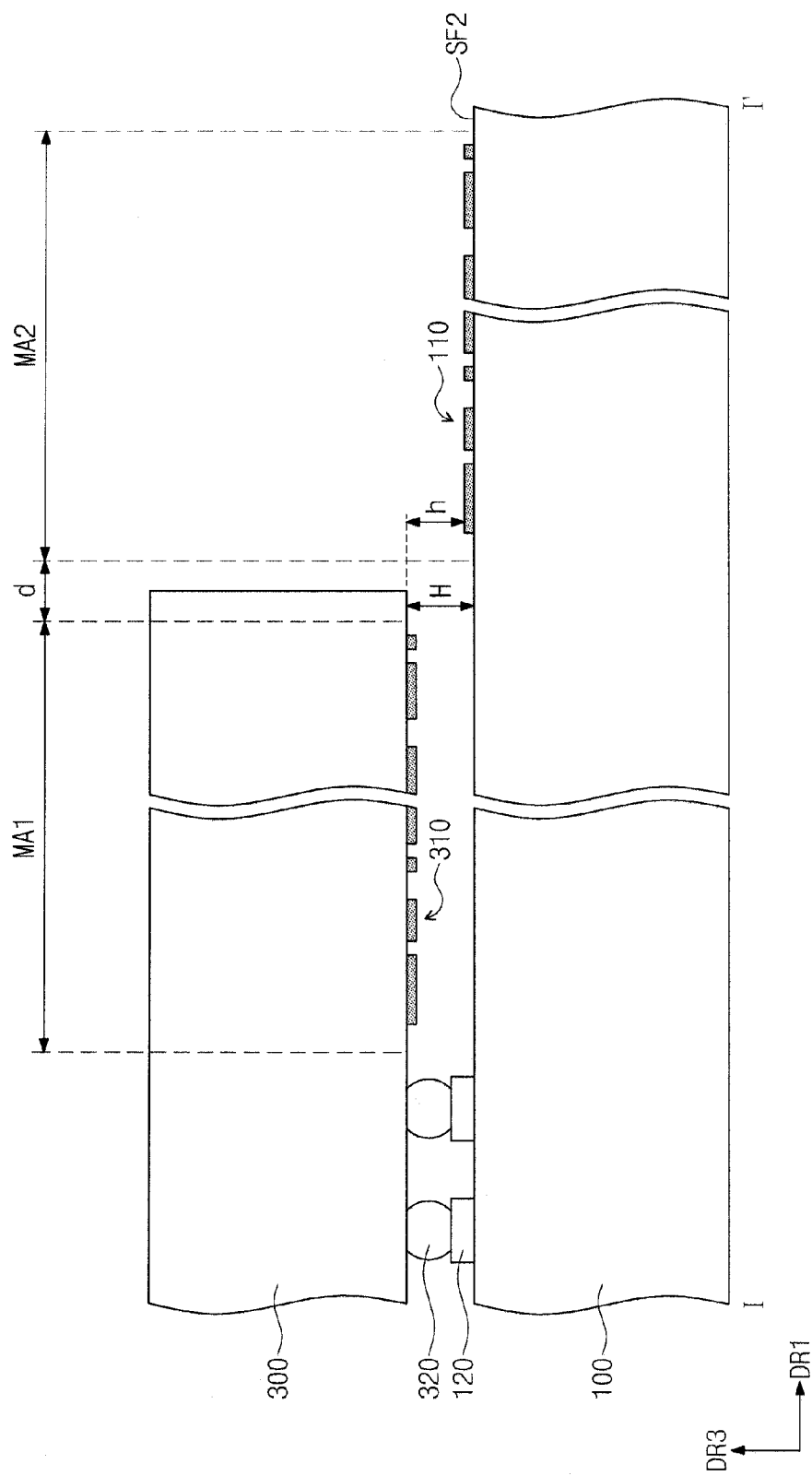
FIG. 6 is a cross-sectional view taken along line I-I' illustrated in FIG. 1.
Figure 7:
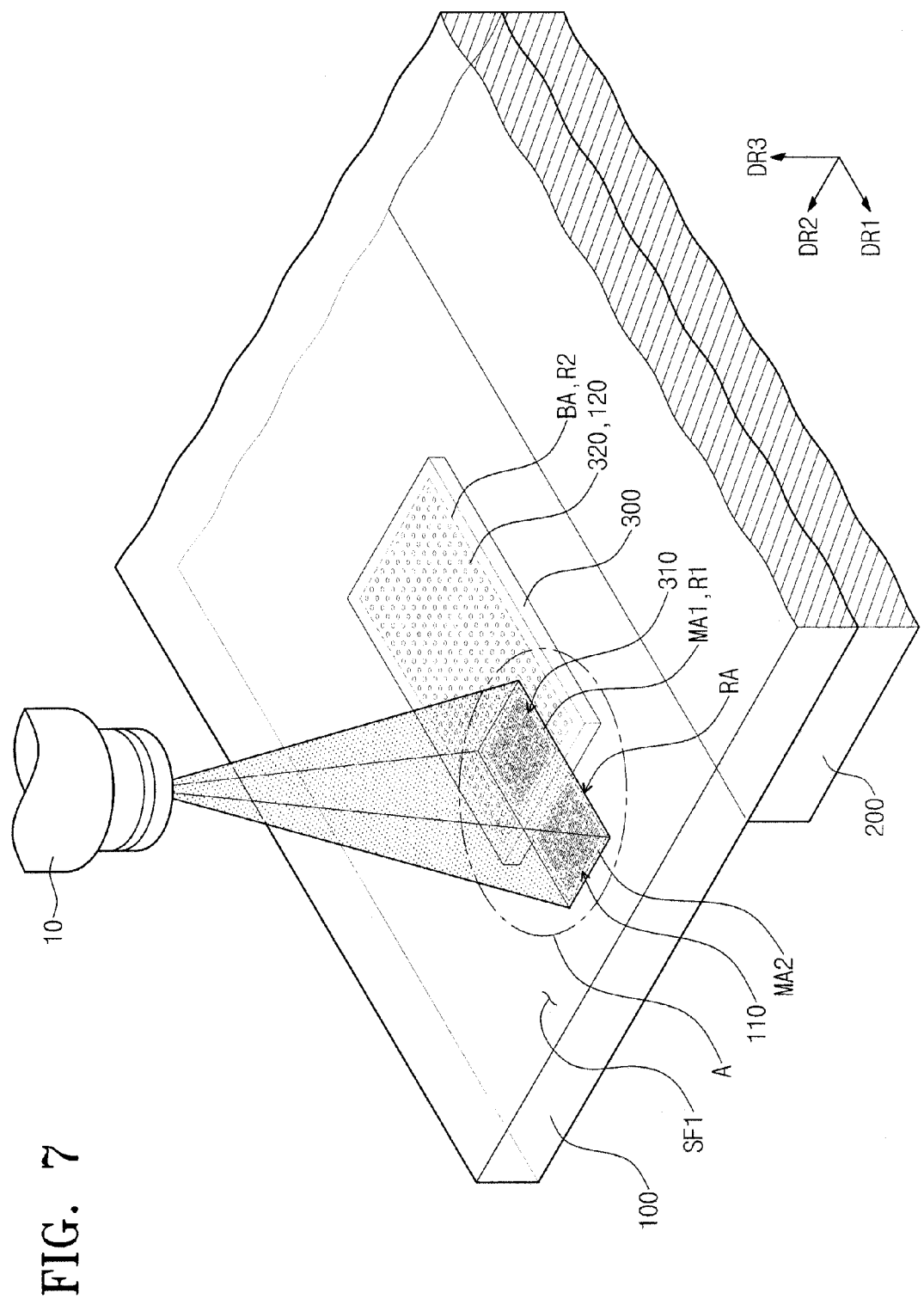
FIG. 7 is a view illustrating a state in which a code reader identifies a first marking code and a second marking code.
Figure 8:
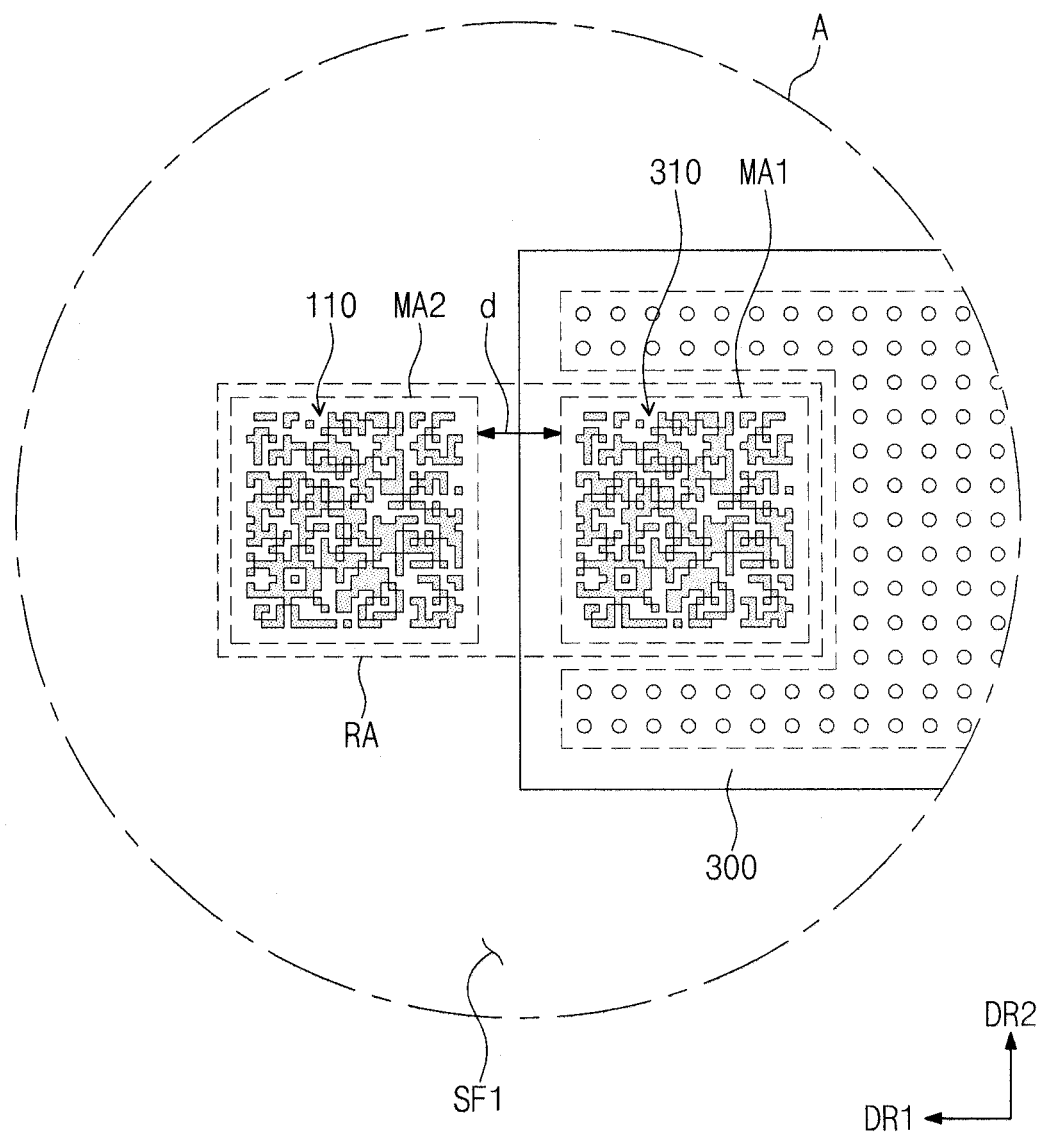
FIG. 8 is an enlarged view of region A illustrated in FIGS. 2 and 7.

FIG. 6 is a cross-sectional view taken along line I-I' illustrated in FIG. 1, and FIG. 7 is a view illustrating a state in which a code reader identifies a first marking code and a second marking code. FIG. 8 is an enlarged view of region A illustrated in FIGS. 2 and 7.

Referring to FIG. 6, the first marking code 310 and the second marking code 110 may be printed by a laser on the first and second marking code areas MA1 and MA2. However, the embodiment of the inventive concept is not limited to the method for printing the first and second marking codes 310 and 320. For example, according to another embodiment of the inventive concept, the first and second marking codes MA1 and MA2 may be printed through an inkjet printing method on the first and second marking code areas MA1 and MA2.

The driving chip 300 and the lower substrate 100 define a first gap H therebetween. The first gap H is equal to the distance between the driving chip and the lower substrate 100 when the bumps 320 and contact terminals 120 are connected. Since the first marking code 310 is positioned on the rear surface of the driving chip 300, and the second marking code 110 is positioned on the second surface SF2 of the lower substrate 100, a step difference h may be formed between the first marking code 310 and the second marking code 110.

According to an embodiment of the inventive concept, the first and second marking codes 310 and 110 are printed through relief printing. Accordingly, the first gap H is greater than the height of the step h. However, according to another embodiment of the inventive concept, the first and second marking codes 310 and 110 may be printed through intaglio printing. In this case, the first gap H may be smaller than the height of the step difference h.

Referring to FIGS. 7 and 8, the code reader 10 reads the patterns of the first and second marking codes 310 and 110. Since the lower substrate 100 is formed of a transparent material, the code reader 10 reads the patterns of the first and second marking codes 310 and 110 of the lower substrate 100 by using light passing through the lower substrate 100.

In embodiments, the code reader 10 includes a capture part, a memory part, a control unit, and a display part. The capture part captures patterns of the first and second marking codes 310 and 110. For example, the capture part may include a camera. The memory part stores the identification information of the first and second marking codes 310 and 110. The control part controls the display part to display the identification information corresponding to the image information received from the capture part.

The first and second marking code areas MA1 and MA2 are located adjacent to each other. The range of the 'adjacency' means a distance such that the first and second marking code areas MA1 and MA2 overlap the reading range RA of the code reader 10. In an embodiment of the inventive concept, gap d between the first and second marking code areas MA1 and MA2 in the first direction DR1 is smaller than a width of any one marking code areas MA1 and MA2 from among the first and second marking code areas MA1 and MA2 in the first direction DR1.

According to an embodiment of the inventive concept, the first and second marking code areas MA1 and MA2 may overlap the reading range RA of the code reader 10. Accordingly, the first and second marking code areas MA1 and MA2 may be simultaneously read by the code reader 10. According to an embodiment of the inventive concept, the identification information about the display panel DP and the driving chip 300 may be easily acquired.

Figure 9:
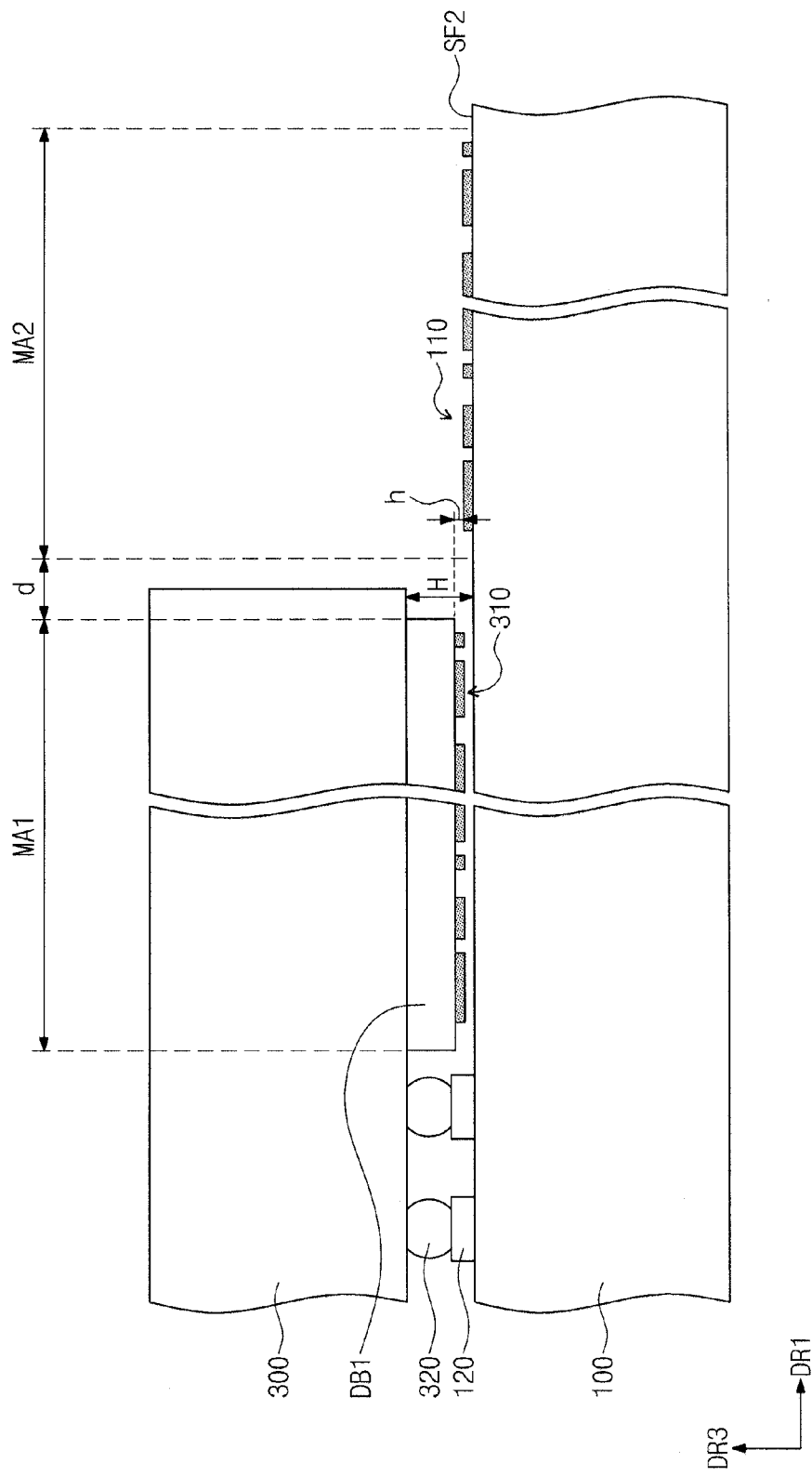
FIG. 9 is a cross-sectional view illustrating a display apparatus according to another embodiment of the inventive concept.

FIG. 9 is a cross-sectional view illustrating a display apparatus according to another embodiment of the inventive concept. In describing FIG. 9, previously described components will be designated by the same reference numerals, and overlapping descriptions thereof will not be provided.

Referring to FIG. 9, a driving chip 300 according to another embodiment of the inventive concept further includes a first dummy layer DB1. The first dummy layer DB1 has a plate shape. The first dummy layer DB1 is located on a first marking code area MA1.

A first making code 310 is provided on the first dummy layer DB1. Specifically, the first dummy layer DR1 may be located between the first marking code 310 and the rear surface of the driving chip 300.

According to another embodiment of the inventive concept, the first dummy layer DB1 may reduce the size of a step difference h defined between the first marking code 310 and a second marking code 110. Accordingly, when the first and second marking codes 310 and 110 are captured by a code reader 10, defocus due to the step difference h between the first and second marking codes 310 and 110 may be prevented.

Consequently, according to another embodiment of the inventive concept, the identification information about the display panel DP and the driving chip 300 may be more easily acquired.

FIG. 10 is a cross-sectional view illustrating a display apparatus according to another embodiment of the inventive concept. In describing FIG. 10, previously described components will be designated by the same reference numerals, and overlapping descriptions thereof will not be provided.

Referring to FIG. 10, a lower substrate 100 according to another embodiment of the inventive concept further includes a second dummy layer DB2. The second dummy layer DB2 has a plate shape. The second dummy layer DB2 is located on a first marking code area MA1.

A second marking code 110 is provided on the second dummy layer DB2. Specifically, the second dummy layer DB2 may be located between the second marking code 110 and a second surface SF2 of the lower substrate 100.

According to another embodiment of the inventive concept, the second dummy layer DB2 may reduce the size of a step difference h defined between a first marking code 310 and the second marking code 110. Accordingly, when the first and second marking codes 310 and 110 are captured by a code reader 10, defocus due to the step difference h between the first and second marking codes 310 and 110 may be prevented.

Consequently, according to another embodiment of the inventive concept, the identification information about the display panel DP and the driving chip 300 may be more easily acquired.

While exemplary embodiments are described above, a person skilled in the art may understand that many modifications and variations may be made without departing from the spirit and scope of the present disclosure defined in the following claims. Also, embodiments disclosed in the present disclosure are not intended to limit the technical spirit of the present disclosure and the following claims and all technical spirits falling within equivalent scope are construed as being included in the scope of rights of the present disclosure.

What is claimed is:
1. A display apparatus comprising:
a display panel configured to display an image; and
a driving chip including a front surface, a rear surface, and
  a first marking code on the rear surface, the driving chip being electrically connected to the display panel, the first marking code closer to the rear surface than the front surface,
  wherein the display panel comprises:
  an upper substrate; and
  a lower substrate having a second marking code, and including a first surface and a second surface opposite the first surface, the second surface of the lower substrate facing the upper substrate,
  wherein the driving chip is located on the second surface of the lower substrate such that the rear surface of the driving chip is closer to the second surface than the front surface thereof, and wherein the second marking code is on the second surface.

2. The display apparatus of claim 1, wherein the first marking code comprises identification information about the driving chip, and wherein the second marking code comprises identification information about the display panel.

3. The display apparatus of claim 1, wherein the lower substrate further comprises a pad part which is located on the second surface of the lower substrate and is electrically connected with the driving chip, and wherein the second marking code overlaps the pad part.

4. The display apparatus of claim 1, wherein the driving chip comprises a plurality of bumps located on the rear surface thereof, and wherein the first marking code is positioned at an edge of at least one side of the rear surface.

5. The display apparatus of claim 4, wherein the rear surface of the driving chip comprises a first marking code area and a bump area, wherein the first marking code area is defined at one edge of the rear surface of the driving chip, the first marking code is positioned on the first marking code area, and the plurality of bumps are positioned on the bump area.

6. The display apparatus of claim 5, wherein the second surface of the lower substrate comprises a second marking code area, a first region, and a second region, wherein the second marking code is positioned on the second marking code area, the first region overlaps the first marking code area, and the second region overlaps the bump area.

7. The display apparatus of claim 6, wherein the display panel further comprises a plurality of contact terminals located on the second region and being electrically connected with the bumps.

8. The display apparatus of claim 6, wherein the first and second marking code areas are arranged adjacent to each other such that a reading region of a code reader configured to read the first and second marking codes overlaps the first and second marking code areas.

9. The display apparatus of claim 8, wherein the lower substrate further comprises a second dummy layer located between the second surface and the second marking code, wherein the second marking code is provided on the second dummy layer.

10. The display apparatus of claim 6, wherein when viewed on a plane, the first and second marking codes are located at a distance from each other less than a width of each of the first and second marking codes.

11. The display apparatus of claim 10, wherein the driving chip further comprises a first dummy layer located between the first marking code and the rear surface of the driving chip, wherein the first marking code is provided on the first dummy layer.

12. The display apparatus of claim 1, wherein each of the first and second marking codes is a laser marking.

13. The display apparatus of claim 1, wherein the first and second marking codes are printed in relief.

14. A display apparatus comprising:
a display panel configured to display an image; and
a driving chip including a plurality of bumps on a bump surface and a first marking code on the bump surface,
wherein the display panel includes:
an upper substrate; and
a lower substrate having a front surface, a rear surface, a plurality of contact terminals connected to the bumps and a second marking code, the front surface of the lower substrate facing the upper substrate,
wherein the front surface of the lower substrate is closer to the bump surface of the driving chip than to the rear surface of the lower substrate, and
wherein the second marking code and the contact terminals are provided on the front surface of the lower substrate.

15. The display apparatus of claim 14, wherein the first marking code comprises identification information about the driving chip, and the second marking code comprises identification information about the display panel.

* * * * *